US006900592B2

(12) United States Patent
Kunhardt et al.

(10) Patent No.: US 6,900,592 B2
(45) Date of Patent: May 31, 2005

(54) METHOD AND APPARATUS FOR STABILIZING OF THE GLOW PLASMA DISCHARGES

(75) Inventors: Erich Kunhardt, Hoboken, NJ (US); Kurt Becker, New York, NY (US)

(73) Assignee: The Trustees of the Stevens Institute of Technology, Hoboken, NJ (US)

( * ) Notice: Subject to any disclaimer, the term of this patent is extended or adjusted under 35 U.S.C. 154(b) by 0 days.

(21) Appl. No.: 10/288,313

(22) Filed: Nov. 5, 2002

(65) Prior Publication Data

US 2003/0085656 A1 May 8, 2003

Related U.S. Application Data

(63) Continuation-in-part of application No. 09/381,328, filed on Dec. 27, 1999, which is a continuation-in-part of application No. 08/820,013, filed on Mar. 18, 1997, now Pat. No. 5,872,426.

(51) Int. Cl.[7] ............................................. H01J 17/00
(52) U.S. Cl. ...................... 313/619; 313/582; 313/583; 313/586
(58) Field of Search ................................ 313/582, 583, 313/586, 619, 231.31

(56) References Cited

U.S. PATENT DOCUMENTS

| | | | |
|---|---|---|---|
| 3,821,588 A | 6/1974 | Przybylek | 313/220 |
| 3,914,642 A | 10/1975 | Coderre et al. | 313/514 |
| 4,698,551 A | 10/1987 | Hoag | 313/619 |
| 5,153,901 A | 10/1992 | Shoulders | 378/119 |
| 5,241,243 A | 8/1993 | Cirri | 315/111.21 |
| 5,248,371 A | 9/1993 | Maher et al. | 156/345 |
| 5,387,842 A | 2/1995 | Roth et al. | 315/111.21 |
| 5,414,324 A | 5/1995 | Roth et al. | 315/111.21 |
| 5,685,949 A | 11/1997 | Yashima | 156/643.1 |
| 5,872,426 A | 2/1999 | Kunhardt et al. | 313/582 |
| 6,005,349 A | 12/1999 | Kunhardt et al. | 315/111.21 |
| 6,147,452 A | 11/2000 | Kunhardt et al. | 313/582 |
| 6,252,353 B1 * | 6/2001 | Ha et al. | 313/582 |

FOREIGN PATENT DOCUMENTS

| | | |
|---|---|---|
| EP | 364-215 | 4/1990 |
| FR | 2342783 | 3/1977 |
| WO | WO 94/19832 | 9/1994 |
| WO | WO 94/28568 | 12/1994 |

OTHER PUBLICATIONS

Akishev, et al., "Numerical Simulation and Experimental Study of an Atmospheric–Pressure Direct–Current Glow Discharge," Plasma Physics Reports, vol. 20 No. 6, 1994, pp. 511–524.

Akiyama, et al., "Suppression of Glow–to–Arc Transition in Atmospheric Pressure Gas Discharge of TEA CO2 Laser by High Frequency Corona Discharges," The Institute of Physics, 1984.

Kanazawa, et al., "Glow Plasma Treatment at Atmospheric Pressure for Surface Modification and Film Deposition," Nuclear Instruments and Methods in Physics Research B37/38 (1989), pp. 842–845.

(Continued)

Primary Examiner—Vip Patel
(74) Attorney, Agent, or Firm—McCarter & English, LLP

(57) ABSTRACT

A method and apparatus for stabilizing glow plasma discharges by suppressing the transition from glow-to-arc includes a perforated dielectric plate having an upper surface and a lower surface and a plurality of holes extending therethrough. The perforated dielectric plate is positioned over the cathode. Each of the holes acts as a separate active current limiting micro-channel that prevents the overall current density from increasing above the threshold for the glow-to-arc transition. This allows for a stable glow discharge to be maintained for a wide range of operating pressures (up to atmospheric pressures) and in a wide range of electric fields include DC and RF fields of varying strength.

25 Claims, 5 Drawing Sheets

OTHER PUBLICATIONS

Kogoma, et al., "Raising of Ozone Formation Efficiency in a Homogenous Glow Discharge Plasma at Atmospheric Pressure," J. Phys. D: Appl. Phys. 27 (1994), pp. 1985–1987.

Okazaki, et al., "Appearance of Stable Glow Discharge in Air, Argon, Oxygen and Nitrogen at Atmospheric Pressure Using a 50 Hz Source," J. Phys. D: Appl. Phys. 26 (1993), pp. 889–892.

Yokoyama, et al., "The Improvement of the Atmospheric Pressure Glow Plasma Method and the Deposition of Organic Films," J. Phys. D: Appl. Phys. 23 (1990), pp. 374–377.

Yokoyama, et al., "The Mechanism of the Stabilisation of Glow Plasma at Atmospheric Pressure," 1990, pp. 1125–1128.

* cited by examiner

METHOD AND APPARATUS FOR STABILIZING OF THE GLOW PLASMA DISCHARGES

RELATED APPLICATION

This application is a continuation-in-part application of U.S. patent application Ser. No. 09/381,328, filed Dec. 27, 1999 by Erich Kunhardt and Kurt Becker, entitled Method and Apparatus for Suppression of the Glow-to-Arc Transition in Glow Discharges, which is a continuation-in-part application of U.S. patent application Ser. No. 08/820,013 filed Mar. 18, 1997, now U.S. Pat. No. 5,872,426, issued Feb. 16, 1999, the entire disclosures of which are expressly incorporated herein by reference.

GOVERNMENT RIGHTS

The present invention has been make under a government contract and the government may have certain rights to the subject invention.

BACKGROUND OF THE INVENTION

1. Field of the Invention

This invention generally relates to a method and apparatus for stabilizing glow plasma discharges, and more specifically to a cathode configuration having a dielectric with a plurality of recesses for stabilizing glow plasma discharges.

2. Related Art

A "plasma" is a partially ionized gas composed of ions, electrons, and neutral species. This state of matter is produced by high temperatures or strong electric fields created by constant or pulsed DC current, AC current or time varying (e.g., R.F. or microwave) electromagnetic fields. Discharge plasmas are produced when free electrons are energized by electric fields in a background of neutral atoms/molecules. These electrons cause electron—atom/molecule collisions which transfer energy to the atoms/molecules and form a variety of species which may include photons, metastables, atomic excited states, free radicals, molecular fragments, monomers, electrons, and ions. The neutral gas becomes partially (or fully) ionized and is able to conduct currents. The plasma species are chemically active and/or can physically modify the surface of materials and may therefore serve as the basis of new chemical compounds and may be used to modify existing compounds. Discharge plasmas can also produce useful amounts of optical radiation and can therefore be used in lighting. There are additionally many other uses for such plasmas. Glow discharges and arc discharges produce a class of plasmas known as current-maintained plasmas, since they are maintained by the passage of current therethrough. Such plasmas conduct only because current is passed therethrough and the conductivity falls off quickly if the source of energy to the charge carriers is removed.

Transition points exist at which the various attributes of the discharge and discharge plasma change from the characteristics of a glow discharge to the characteristics of an arc discharge. The characteristics that distinguish arc from glow are a high gas temperature and a low cathode fall potential, though it is also possible to have a high gas temperature associated with a high cathode fall and vice versa.

The transition from glow to arc passes through a series of stable or quasi-stable states. However, the final step from abnormal glow to arc is very often an unstable change, since a very large potential drop in the series resistance would be required to make it stable. If there is no series resistance, the transition may take place very rapidly, without equilibrium being achieved in any intermediate stage. This transition becomes more rapid as the pressure of the background neutral gas increases towards atmospheric pressure.

In the past, there have been efforts to stabilize glow plasma discharges in various ways such as the use of source frequencies over 1 kHz, insertion of a dielectric plate (or plates) between two metal electrodes and by using helium dilution gas. Additionally, other attempts to stabilize the glow plasma discharge include placement of an insulated plate on the lower electrode, use of a brush-style upper electrode, and the use of a metal upper plate in combination with an insulating plate on the bottom thereof. However, there are certain drawbacks with these requirements in that, e.g. helium is expensive and there are physical limitations based on the structure of the electrodes and the insulated plates.

Past work in this area include a series of articles by Okazaki, Satiko, et al., starting back in 1989 with the article by Kanazaw, S., et al., entitled, "Glow Plasma Treatment at Atmospheric Pressure for Surface Modification and Film Deposition," Nuclear Instruments and Methods in Physics Research (1989) Elsevier Science Publishers, B. V. (North-Holland Physics Publishing Division), which disclosed a plasma treatment at atmospheric pressure to stabilize glow plasma by treatment in a gas which includes carbon-tetrafluoride ($CF_4$), using helium as the dilute gas and using an insulating plate on a lower electrode, and using a brush style electrode for the upper electrode to create a stable discharge at 3,000 Hz.

Yokoyama, T., et al., "The improvement of the atmospheric-pressure glow plasma method and the deposition of organic films," Journal of Physics (1990) IOP Publishing, Ltd., discloses an improved atmospheric pressure glow discharge plasma method for treating metallic substrates wherein the middle plate upper electrode is improved by use of an insulating plate set on its bottom.

Yokoyama, T. et al., "The mechanism of the stabilization of glow plasma at atmospheric pressure," Journal of Physics (1990) IOP Publishing, Ltd., discloses stabilization of a glow discharge of atmospheric pressure by controlling three conditions, namely, the use of a high frequency source, the use of helium gas for dilution, and the insertion of a dielectric plate between electrodes.

Okazaki, Satiko, et al., "Appearance of stable glow discharge in air, argon, oxygen, and nitrogen at atmospheric pressure using a 50 Hz source," Journal of Physics, (1993) IOP Publishing, Ltd., discloses a method and apparatus for stabilizing glow discharge by making the discharge occur in the early stages of the Kekez curve, and at a lower discharge breakdown voltage, by use of a metal wire mesh electrode.

Kogoma, Masuhiro, et al., "Raising of ozone formation efficiency in a homogeneous glow discharge plasma at atmospheric pressure," Journal of Physics (1994) IOP Publishing, Ltd., discloses an ozone formation apparatus for increasing the efficiencies of ozone formation by use of a homogenous glow discharge at atmospheric pressure to create ozone efficiencies increased to about 10% in air to a maximum of 15% in oxygen over conventional filamentary current discharges in gas. The increase is attributed to better collision efficiency among electrons and molecules and to a lower increase in temperature than in discharge filaments of a silent electric discharge.

Other work in this area includes U.S. Pat. No. 4,498,551 to Hoag, entitled, "Discharge Electrode for a Gas Discharge Device," which uses pin-shaped electrodes which are effectively cooled in the glass flow and which promote a stable glow-discharge.

U.S. Pat. No. 5,387,842 dated Feb. 7, 1995 to Roth, et al., entitled, "Steady-State, Glow Discharge Plasma," and U.S. Pat. No. 5,414;324 dated May 9, 1995 to Roth, et al., entitled "One Atmosphere, Uniform Glow Discharge Plasma," both disclose a steady state glow discharge plasma generated between a pair of insulated metal plate electrodes spaced up to five centimeters apart and energized with a RMS potential of 1 to 5 KV at 1 to 100 Khz. The space between the electrodes is occupied by a noble gas such as helium, neon, argon, etc., and it may also include air. The radio frequency amplifier means for generating and maintaining a glow discharge plasma includes an impedance matching network. The arc of electric field is high enough to trap the positive ions of the plasma between the electrodes, but not so high that the electrons of the plasma are also trapped during a half cycle of the RF voltage.

None of these previous efforts disclose all of the benefits of the present invention, nor does the prior art teach or suggest all of the elements of the present invention.

OBJECTS AND SUMMARY OF THE INVENTION

It is a primary object of the present invention to provide a method and apparatus for stabilizing glow discharge plasmas.

It is another object of the present invention to provide a method and apparatus for suppressing the glow-to-arc transition in glow discharges.

It is an additional object of the present invention to provide a method and apparatus to stabilize glow discharge plasmas in a constant electric field.

It is even an additional object of the present invention to provide a method and apparatus to stabilize glow discharge plasmas in time varying electric fields.

It is another object of the invention to provide a cathode configuration for stabilizing the cathode fall in a glow discharge.

It is an additional object of the present invention to provide a method and apparatus for suppressing the glow-to-arc transition for a wide range of operating conditions and a wide range of operating pressures.

It is also an object of the present invention to provide a method and apparatus for suppressing the glow-to-arc transition for a wide range of electric field strengths.

It is an additional object of the present invention to reduce the complexity and costs of plasma processing of materials.

These and other objects are achieved by the method and apparatus of the present invention for stabilizing glow plasma discharges by suppressing the transition from glow-to-arc. A dielectric having an upper surface and a lower surface and a plurality of recesses extending partially therethrough is positioned over the cathode. Each of the holes acts as a separate active current limiting micro-channel that prevents the overall current density from increasing above the threshold for the glow-to-arc transition.

BRIEF DESCRIPTION OF THE DRAWINGS

Other important objects and features of the invention will be apparent from the following Detailed Description of the Invention when read in context with the accompanying drawings in which.

DETAILED DESCRIPTION OF THE INVENTION

Figure 1:
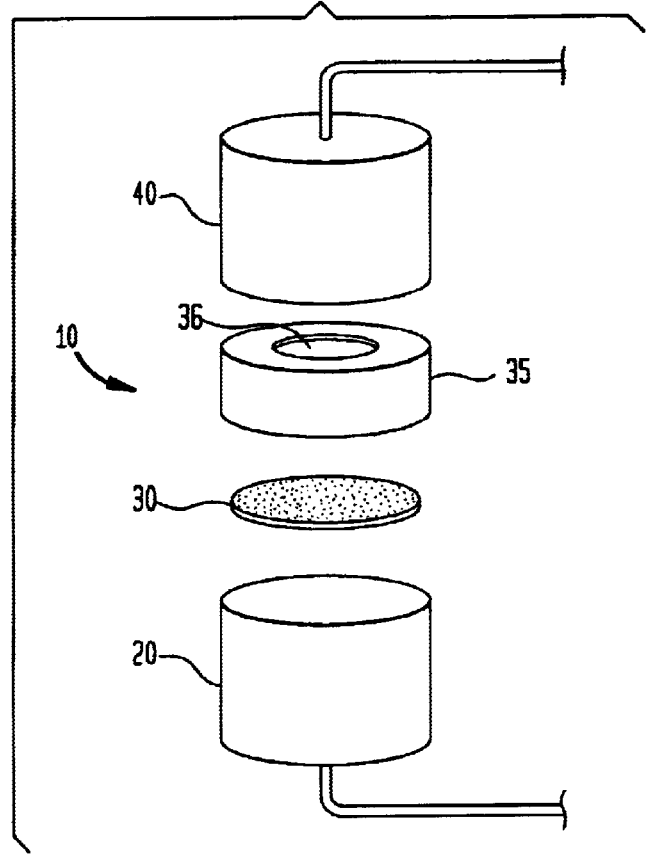
FIG. 1 is an exploded perspective view of the perforated dielectric covering a cathode of a DC embodiment of the present invention.

The present invention is directed to a method and apparatus for stabilizing plasma glow discharges by suppressing the glow-to-arc transition in DC, RF electric field, pulsed DC, AC current or any other glow discharges which evolves from the cathode fall region. Referring to FIG. 1, it can been seen that a new cathode configuration has been developed to stabilize the cathode fall and suppress the glow-to-arc transition for a wide range of operating conditions. Accordingly, a stable glow discharge can be maintained with the cathode configuration of the present invention for a very wide range of operating pressures (up to atmospheric pressures) and in a wide range of electric field strengths.

Referring to FIG. 1, which shows a DC embodiment, the cathode of the present invention, generally indicated at 10, comprises a metal cathode 20 (aluminum, stainless steel, etc.), covered with a perforated dielectric 30 positioned to face an upper electrode 40. The perforated dielectric 30 may be retained on the cathode 20 by a collar 35 that fits over cathode 20 and has an aperture 36 therethrough, or may be formed as part of a cap or cover for the cathode 20, or may be positioned thereon and held in place thereon in any other manner known in the art.

Importantly, the perforated dielectric can be formed of any desired dielectric type substance such as quartz, silicon nitride, silicon carbide, etc., even glass. The dielectric is preferably formed of a material that can withstand high temperatures. Essentially, a perforated dielectric comprises a sieve of holes of micron dimensions. The center to center distance of the holes is of the same level of dimension. Hole dimensions are critical for particular applications. In trials discussed hereinafter, a dielectric having 10 micron holes with a center to center distance between the holes of 12 microns was used. Hole dimensions can vary from 5 to 200 $\mu$m for the hole diameter and from between 100 $\mu$m to 2 mm for the hole length (thickness of the dielectric). Importantly, the ratio of the hole diameter to the dielectric thickness is an important factor and something that can be controlled depending upon the application. One example of such a ratio could be 10 to 1, the hole diameter being one-tenth of the thickness of the dielectric.

The perforated dielectric can be made by laser ablation. Blanks for dielectric plates made by Norton International can be used, and function in a desirable matter (a dielectric having a hole diameter of 10 $\mu$m, and a hole length of 0.6 mm). The hole diameter, hole lengths, hole density, and material can be varied to optimize the invention for a particular application. Any silicon carbide wafer can be perforated by laser ablation to form a perforated dielectric for use in connection with the present invention.

Figure 2:
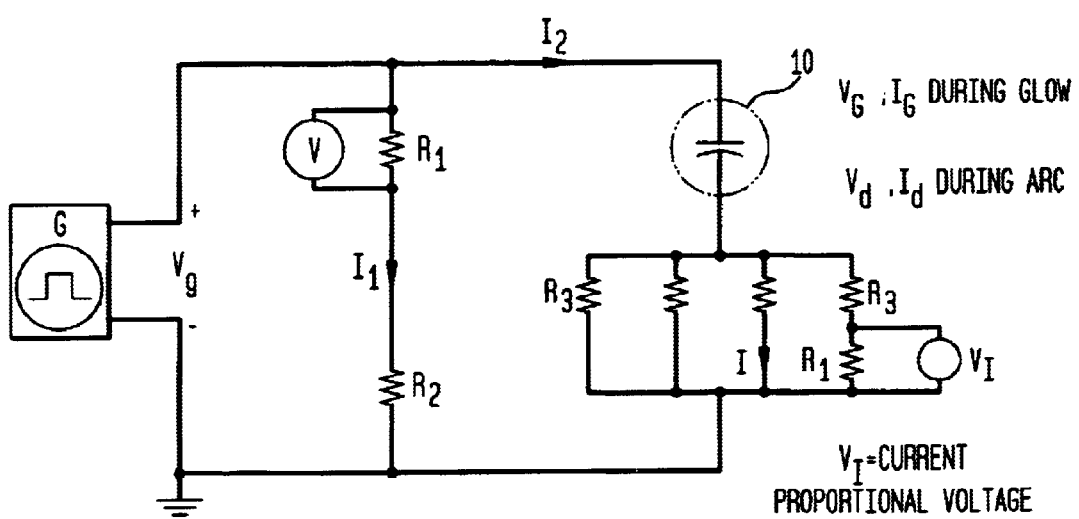
FIG. 2 is a schematic view of a circuit configuration for use with the present invention.

Referring to FIG. 2, shows a circuit that has been used to conduct trials of the present invention that will hereinafter be discussed, which can be used with the cathode configuration of the present invention to effect a stable DC glow plasma discharge. The circuit is governed by equation (1):

$$V_s = I_1(R_1 + R_2) = \frac{1}{R_1}(R_1 + R_2)V \quad \text{Equation (1)}$$

where $$I_2 = 4I$$

$$R_E \cong \frac{R_3}{4} \text{ (for } R_1 << R_3\text{)}$$

$$V_g = V_s - I_g R_3$$

$$V_d = V_s - I_d R_3$$

In this way, by measuring voltage V across resistor R, and current i through resistor $R_1$, we can calculate the voltage and the current across the cathode 10.

The present invention allows DC glow discharges, which have a well known instability that limits the operating range, to operate at much higher pressure up to atmospheric pressures. Accordingly, this stabilization allows for applications in many aspects of material processing, pollution remediation, novel lighting devices, and discharge-enhanced combustion.

The perforated dielectric covering the metal cathode stabilizes the cathode fall region of the DC discharge by breaking the discharge up into a large number of separate micro-channels. Each of the holes comprising the perforated dielectric acts as a separate, active current-limiting micro-channel. Particle losses due to wall effects and the finite volume of each channel place an upper limit on the electrical conductivity of each channel, and therefore place an upper limit on the current density that it can carry. This prevents the current density from increasing above the threshold for the glow-to-arc transition.

Additionally, it should be noted that a dielectric material could be directly deposited in a proper geometry directly onto a cathode by a vapor deposition or other process to apply the dielectric directly to the cathode. In this way, the cathode itself becomes an active current-limiting device.

A prototype DC glow discharge apparatus was set up using a parallel plate electrode arrangement in an Argon atmosphere of between 10–100 Torr, to illustrate the present invention. At these pressures, the phases of the glow-to-arc transition can be readily shown because the transition is sufficiently slow. The transition at atmospheric pressures occurs very rapidly and is difficult to observe. However, it should be pointed out that the present invention is designed to be used at pressures up to atmospheric pressures. Current voltage characteristics were recorded for a variety of operating conditions using a standard metal (Al) cathode. The measured curves show the well-known first transition corresponding to the breakdown of gas in the formation of a stable glow discharge, followed by a prominent second transition characteristic of the transition from the glow regime to an arc which creates a filamentary (high current density) channel. Subsequently, the conventional cathode was replaced by the new cathode design and the same current-voltage curves were recorded. All curves showed only the first transition to the stable high-current glow. No indications of the previously observed glow-to-arc transition were found under any operating conditions. The spatial distribution of the discharge is also diffuse.

Figure 3:
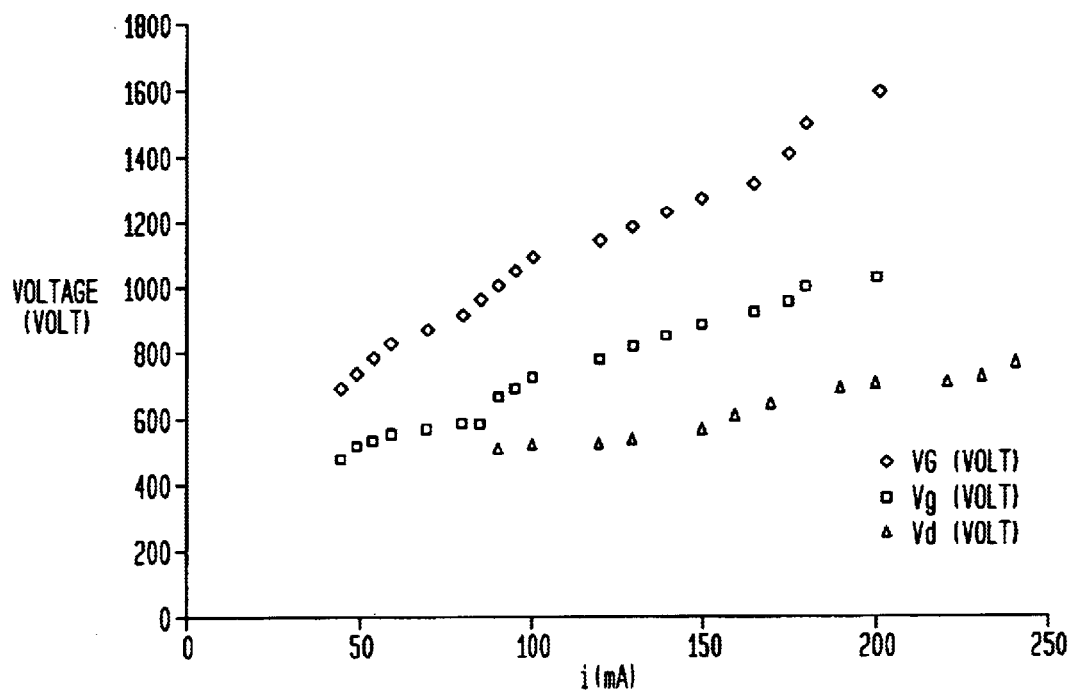
FIG. 3 is a graph of voltage v. current for applied voltage, glow voltage, and arc voltage in Argon at 40 Torr.
Figure 4:
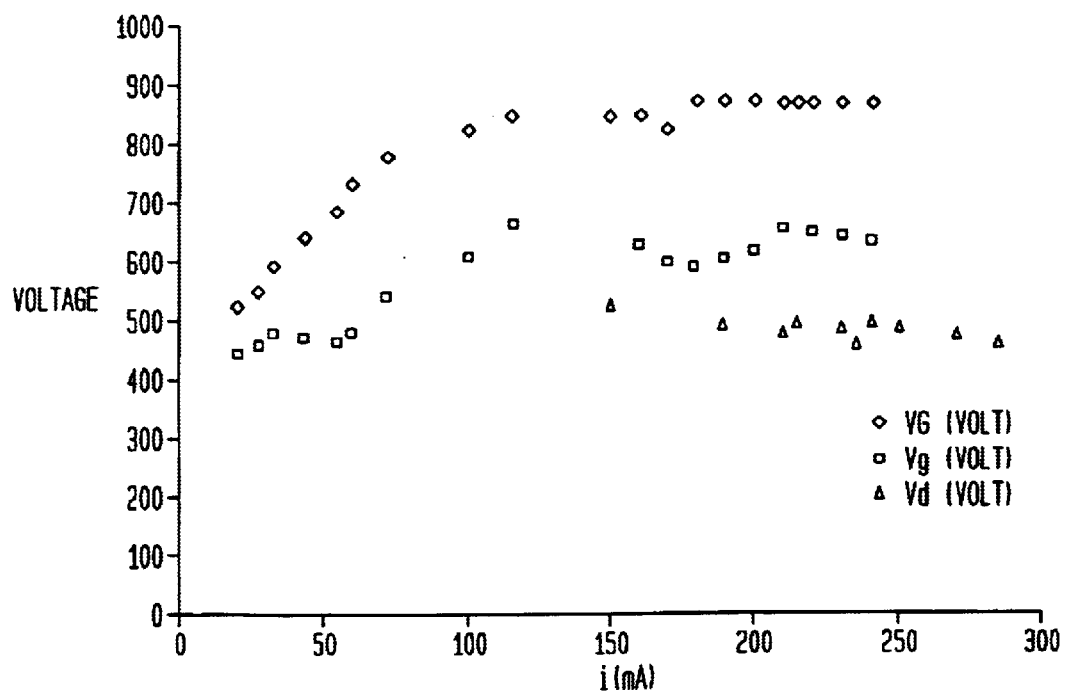
FIG. 4 is a graph of voltage v. current for applied voltage, glow voltage, and arc voltage in Argon at 20 Torr.

Referring now to FIG. 3, a graph of voltage vs. current for applied voltage (VG), glow voltage (Vg) and arc voltage (Vd) is shown for Argon at 40 Torr. FIG. 4 shows a graph of voltage vs. current for applied voltage (VG), glow voltage (Vg), and arc voltage (Vd) in Argon at 20 Torr.

Figure 5A:
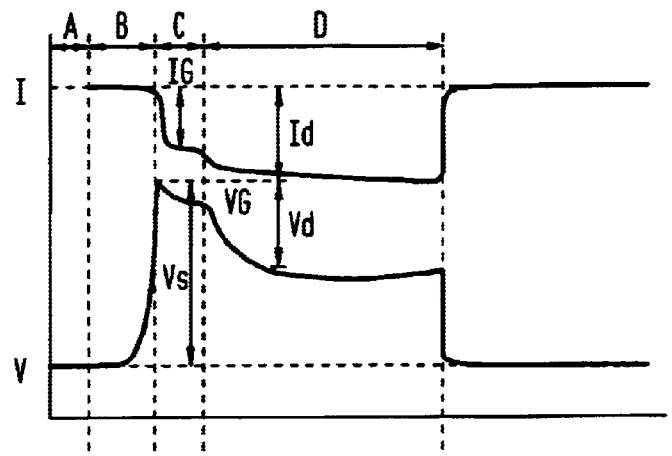
FIGS. 5a and 5b are graphs of applied voltage, glow voltage and arc voltage with and without the perforated dielectric of the present invention.
Figure 5B:
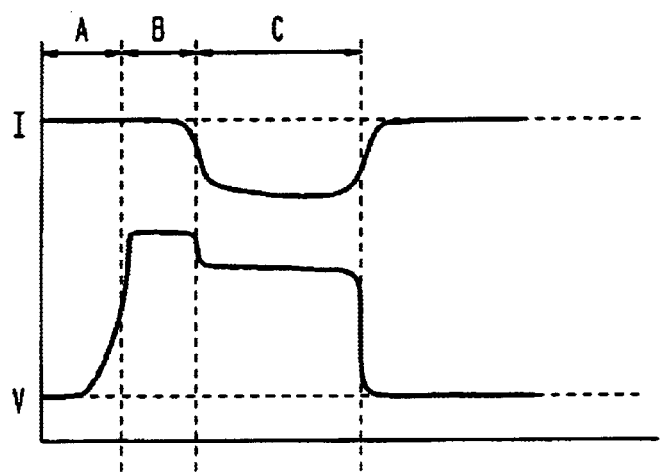

FIGS. 5a and 5b are graphs of the applied voltage and glow-to-arc voltage with and without the perforated dielectric of the present invention. These figures show the stabilization of the glow plasma discharge. In a first Stage A, there is no current. In the second Stage B, voltage is applied, but current stays at zero. In a third Stage C, a glow discharge is achieved. As seen in FIG. 5a, the glow quickly goes to arc D, while in FIG. 5b, the perforated dielectric suppresses the glow-to-arc transition and stabilizes the glow discharge such that there is no arc.

Figure 6A:
FIG. 6a is a photograph showing an arc discharge and FIG. 6b is a photograph showing a glow discharge.
Figure 6B:
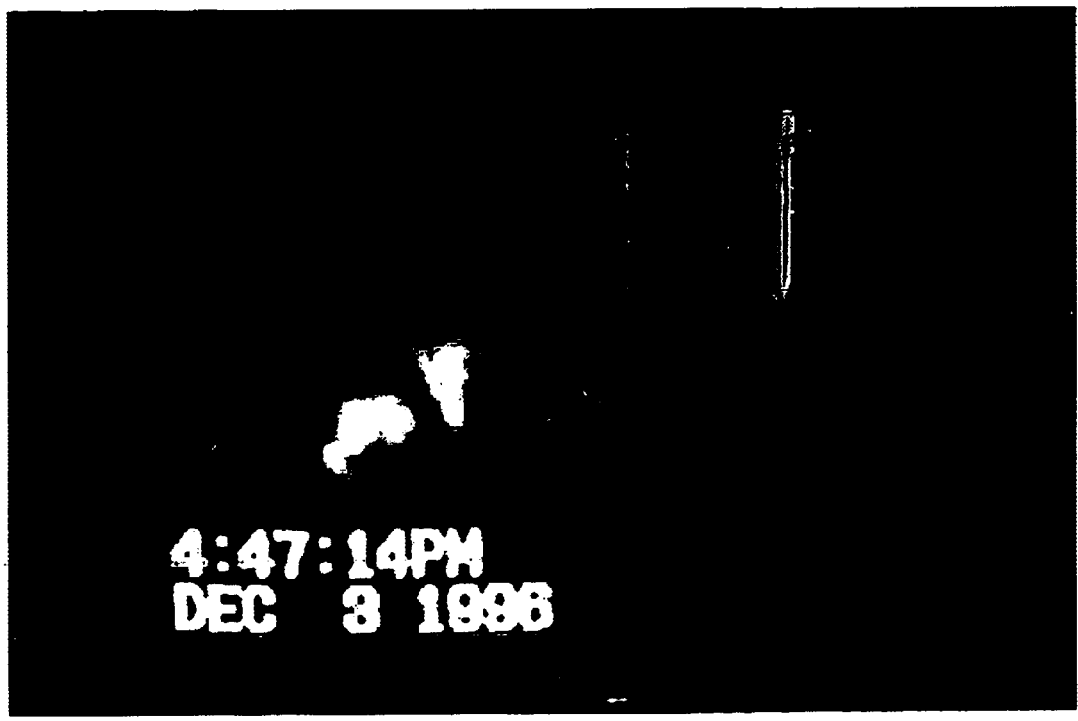

FIG. 6a is a photograph showing an arc discharge which creates a filamentary (high current density) channel. FIG. 6b is a photograph showing a glow discharge characterized by a uniform glow discharge.

Figure 7:
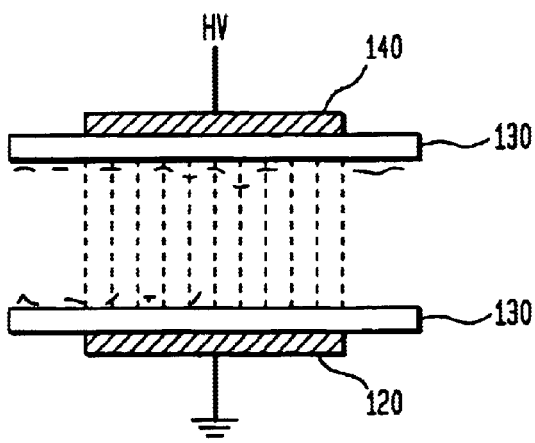
FIG. 7 is a side plan view of another embodiment of the present invention for an RF field wherein perforated dielectrics are positioned over both electrodes.

FIG. 7 is a side plan view of an RF discharge embodiment of the present invention wherein the perforated dielectric is positioned over both electrodes. As can be seen electrodes 120 and 140 are both covered by a perforated dielectric 130. Because the current reverses itself in a RF electric field, the dielectric 130 must be positioned over both electrodes 120 and 140, as both electrodes alternately serve as cathodes. By this configuration, the glow discharge can be sustained under broader operating conditions. Such a configuration results in a frequency independent and size independent device.

By applying the method and apparatus of the present invention to large volume plasmas at atmospheric pressures, it is possible to increase the energy released during combustion of fuels to levels several times higher than the Heating Value of the fuel. Efforts in this area in the past have failed because the distribution of energy is required over a substantial volume and cannot be concentrated in a small area. Because of the glow-to-arc transition, there has been tendency to produce arcs of a very high energy level with the rest of the volume remaining at a normal combustion level. By suppressing the glow-to-arc transition and stabilizing the plasma glow, the method and apparatus of the present invention overcomes the limitations of the prior attempts and results in an enhancement of the combustion process resulting in much higher energy densities than could be previously achieved.

Additional applications of the present invention may occur in the field of air pollution remediation where stabilization of the glow-to-arc transition may result in real time destruction of constituents of air emissions from manufacturing operations in remediation of soil and ground water pollution, in large volumes at high pressures. By suppressing the glow-to-arc transition and stabilizing the glow discharge, the present invention creates large volume plasmas to destroy the polluting vapors at higher efficiencies with reduced cost. There could be additional applications relating to the destruction of combustion by-products such as $NO_x$ and $SO_x$ which have heretofore been destroyed by pulsed corona and barrier discharges.

The present invention is additionally applicable to the cleaning of lithography sheet surfaces in atmospheric pressures. Additionally, there may be possible utility for large area surface cleaning at atmospheric pressure for curing polymer films. By being able to operate at atmospheric pressure, a great advantage is achieved over the high processing cost required in a vacuum process. Additionally, the present invention can be used for pretreatment of semiconductors, glasses, and polymers which are to be used for direct metal ion beam processing.

Additionally, an atmospheric pressure glow discharge plasma can be used to sterilize biologically contaminated surfaces. Current techniques in this area utilize high temperatures, strong chemicals, and/or ultraviolet radiation to sterilize contaminated items. However, there are problems with these approaches in that the processes are time intensive and potentially hazardous and result in the formation of potentially hazardous by-products. It has been demonstrated that materials exposed to a one-atmosphere pressure glow discharge plasma can be sterilized of biological contaminants in under one minute.

Figure 8:
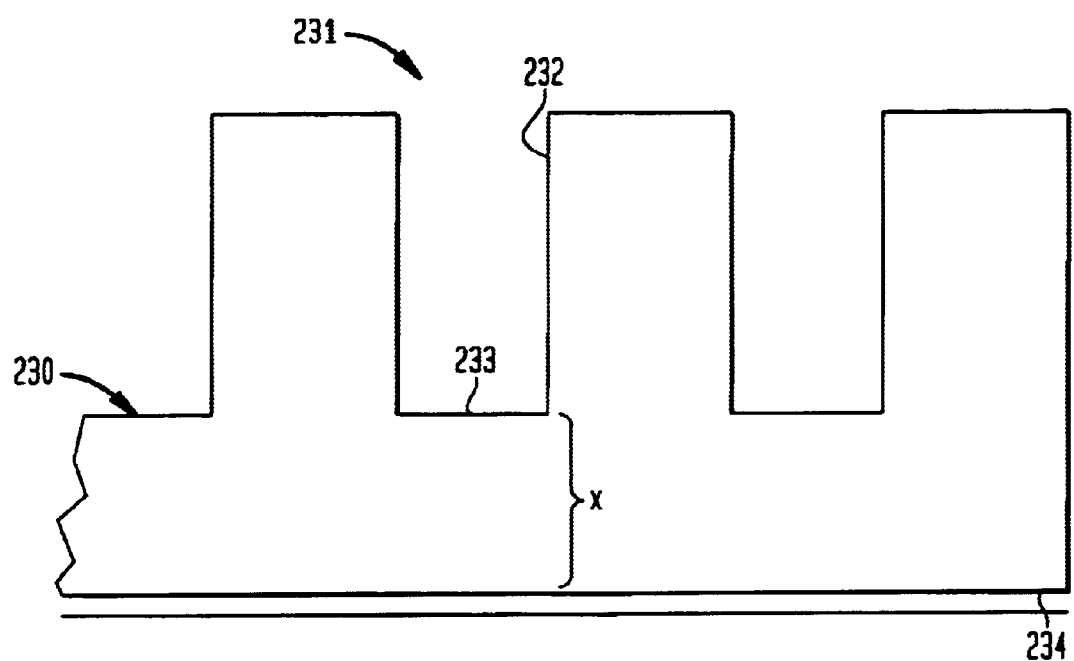
FIG. 8 is a partial view of a dielectric of an alternate embodiment having blind apertures.

In another embodiment as shown in FIG. 8, the dielectric 230 includes blind apertures 231. By "blind" what is meant is that the aperture extends only partially through the dielectric, not entirely through. Anotherwords, the dielectric 230 includes a plurality of recesses 231 extending partially through the dielectric. The recesses are defined by sidewalls 232 and bottom wall 233. A solid component having a thickness x is defined between bottom wall 233 of the open portion and bottom 234 of the dielectric. Importantly, this solid component serves to regulate the energy available to the discharge when an alternating current is used. The dielectric portion provides for storage capacitance to the device and serves to moderate the electric discharge to create a glow plasma that can be tailored for specific applications. The dielectric 230 can be made of any dielectric material known in the art. The size of the recesses can vary from very small (on the order of 5 µm) to large (millimeters). The thickness of the solid component can range from a few microns to hundreds of microns.

Having thus described the invention in detail, it is to be understood that the foregoing description is not intended to limit the spirit and scope thereof. What is desired to be protected by the Letters Patent is set forth in the appended claims.

What is claimed is:

1. An apparatus for generating and maintaining a glow plasma discharge comprising:
    a pair of electrodes positioned in facing relation having a space therebetween;
    a dielectric layer having a plurality of recesses positioned over one of the electrodes, each of the recesses having a bottom wall, side walls, and a depth less than the thickness of the dielectric layer; and
    an electric field generated between the electrodes.

2. The apparatus of claim 1, wherein each of the plurality of recesses limits current density from increasing above a glow-to-arc transition threshold.

3. The apparatus of claim 1, further comprising a second dielectric layer positioned over the other of the electrodes.

4. The apparatus of claim 3, wherein the second dielectric layer includes a plurality of recesses, each of the recesses having a bottom wall, sidewalls, and a depth less than the thickness of the second dielectric.

5. The apparatus of claim 4, wherein each of the plurality of recesses limits current density from increasing above a glow-to-arc transition threshold.

6. An apparatus for generating and maintaining a glow plasma discharge comprising:
    a pair of electrodes positioned in facing relation having a space therebetween;
    a dielectric having a plurality of recesses placed over one of the electrodes and partially occupying the space, the dielectric including a solid component between lower ends of the recesses and a bottom side;
    a second dielectric having a plurality of recesses placed over the other of the electrodes; and
    an electric field generated between the electrodes.

7. The apparatus of claim 6, wherein the second dielectric includes a second solid component between lower ends of the recesses and a bottom side.

8. The apparatus of claim 6, further comprising a retaining collar retaining the dielectric to one of the electrodes.

9. The apparatus of claim 8, further comprising a second retaining collar for retaining the second dielectric to the other of the electrodes.

10. A method of stabilizing glow-to-arc transition for a discharge plasma comprising the steps of:
    positioning electrodes in a facing relation;
    providing a dielectric having a plurality of recesses;
    covering one of the electrodes with the dielectric; and
    covering the other of the electrodes with a second dielectric including a plurality of recesses.

11. The method of claim 10, wherein the step of providing the dielectric comprises providing a dielectric having a solid component between lower ends of the recesses and a bottom side.

12. The method of claim 10, wherein the step of covering the other of the electrodes comprises covering the other of the electrodes with a second dielectric having a solid component between lower ends of the recesses and a bottom side.

13. The method of claim 10, further comprising retaining the dielectric to one of the electrodes with a first retaining collar.

14. The method of claim 13, further comprising retaining the second dielectric to the other of the electrodes with a second retaining collar.

15. An apparatus for generating and maintaining a glow plasma discharge comprising:
    a pair of electrodes positioned in facing relation having a space therebetween;
    a dielectric having a plurality of recesses positioned over one of the electrodes and partially occupying the space for limiting current density from increasing above a glow-to-arc transition threshold, the dielectric including a solid component between lower ends of the recesses and a bottom side;
    a second dielectric having a plurality of recesses placed over the other of the electrodes; and
    an electric field generated between the electrodes.

16. The apparatus of claim 15, wherein the second dielectric includes a second solid component between lower ends of the recesses and a bottom side.

17. The apparatus of claim 16, further comprising a retaining collar for retaining the dielectric to one of the electrodes.

18. The apparatus of claim 17, further comprising a second retaining collar for retaining the second dielectric to the other of the electrodes.

19. The apparatus of claim 15, wherein the second dielectric limits current density from increasing above a glow-to-arc transition threshold.

20. A method of stabilizing glow-to-arc transition for a discharge plasma comprising the steps of:

positioning electrodes in a facing relation;

providing a dielectric having a plurality recesses positioned over the electrode for limiting current density from increasing above a glow-to-arc transition threshold;

covering one of the electrodes with the dielectric; and covering the other of the electrodes with a second dielectric including a plurality of recesses.

21. The method of claim 20, wherein the step of providing the dielectric comprises providing a dielectric having a solid component between lower ends of the recesses and a bottom side.

22. The method of claim 20, wherein the step of covering the other of the electrodes comprises covering the other of the electrodes with a second dielectric having a solid component between lower ends of the recesses and a bottom side.

23. The method of claim 20, further comprising retaining the dielectric to one of the electrodes with a first retaining collar.

24. The method of claim 23, further comprising retaining the second dielectric to the other of the electrodes with a second retaining collar.

25. The method of claim 20, wherein the step of covering the other of the electrodes comprises covering the other of the electrodes with a second dielectric including plurality of recesses for limiting current density from increasing above a glow-to-arc transition threshold.

* * * * *